United States Patent [19]

Kleks

[11] Patent Number: 4,814,642

[45] Date of Patent: Mar. 21, 1989

[54] SWITCHED IMPEDANCE COMPARATOR

[75] Inventor: Jonathan A. Kleks, Redondo Beach, Calif.

[73] Assignee: TRW Inc., Redondo Beach, Calif.

[21] Appl. No.: 94,988

[22] Filed: Sep. 10, 1987

[51] Int. Cl.⁴ .......................... H03K 5/153; H03K 5/24
[52] U.S. Cl. .................................. 307/350; 307/362; 307/530; 307/279
[58] Field of Search ............... 307/350, 530, 279, 291, 307/362

[56] References Cited

U.S. PATENT DOCUMENTS

| | | |
|---|---|---|
| 3,849,734 | 11/1974 | Grass . |
| 4,147,943 | 4/1979 | Peterson . |
| 4,181,865 | 1/1980 | Kohyama ........................... 307/530 |
| 4,247,791 | 1/1981 | Rovell ................................ 307/530 |
| 4,249,095 | 2/1981 | Hsu . |
| 4,253,163 | 2/1981 | Komoriya et al. .................. 307/530 |
| 4,262,221 | 4/1981 | Dingwall . |
| 4,264,872 | 4/1981 | Suzuki . |
| 4,511,810 | 4/1985 | Yukawa ............................. 307/530 |
| 4,542,308 | 9/1985 | Winen . |
| 4,602,167 | 7/1986 | Yukawa ............................. 307/279 |
| 4,629,911 | 12/1986 | Bebernes et al. .................... 307/530 |

*Primary Examiner*—John Zazworsky
*Attorney, Agent, or Firm*—Noel F. Heal; Sol L. Goldstein

[57] ABSTRACT

A high-speed synchronous comparator circuit, well suited for use in an analog to digital converter. The circuit is switched between acquisition and regeneration modes and includes an amplifier that is operated with positive feedback loop gain in both modes. In the acquisition mode, a relatively low impedance is connected between internal nodes of the amplifier, to improve acquisition speed and keep the positive feedback loop again less than unity. In regeneration mode, the low impedance is disconnected, resulting in a high positive feedback loop again and a desirably amplified output indicative of the polarity of the input differential signal, and the input signal is isolated from the latching nodes. The invention may be implemented in a variety of fabrication technologies, including gallium arsenide field-effect transistors, complementary metal-oxide semiconductor (CMOS) circuitry, and bipolar transistors.

24 Claims, 6 Drawing Sheets

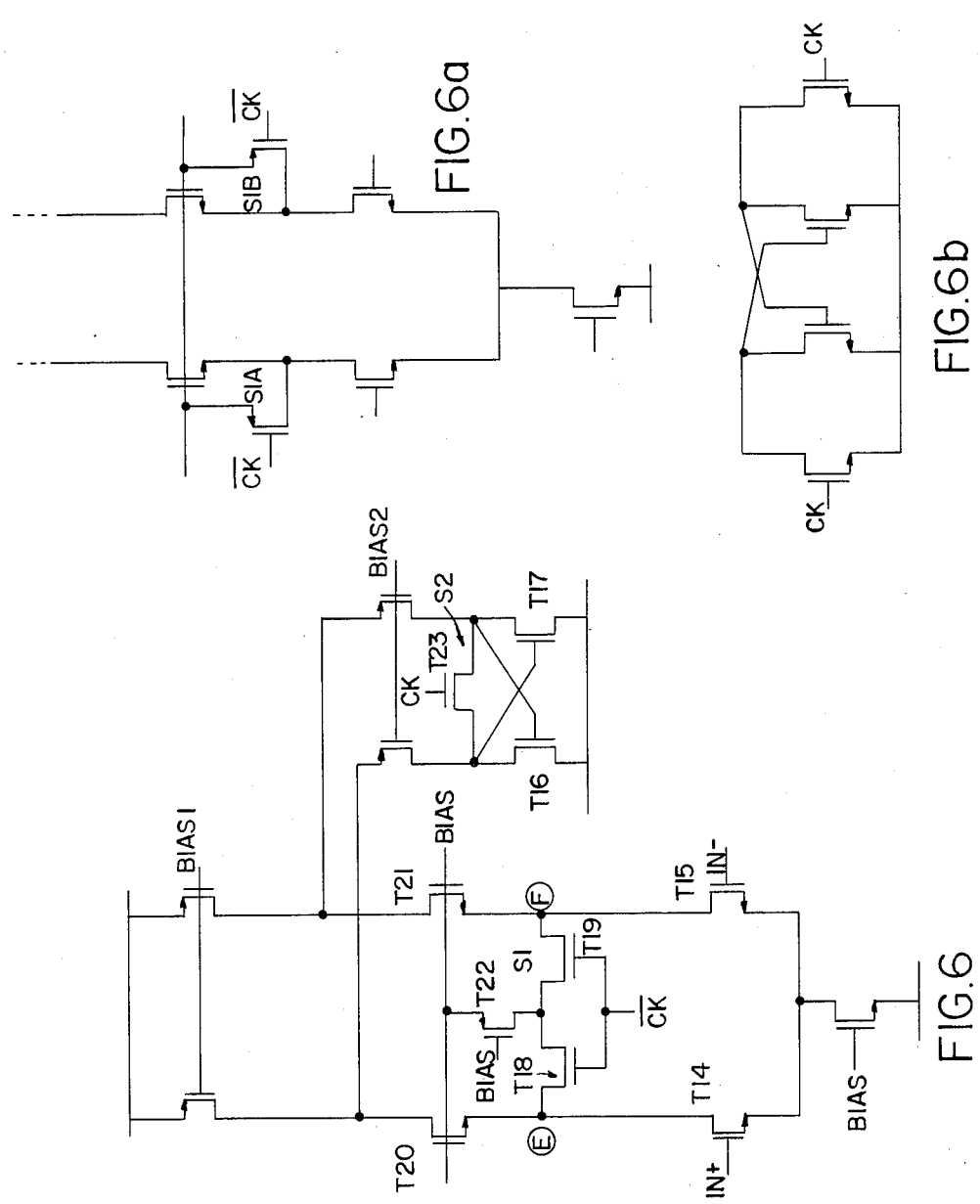

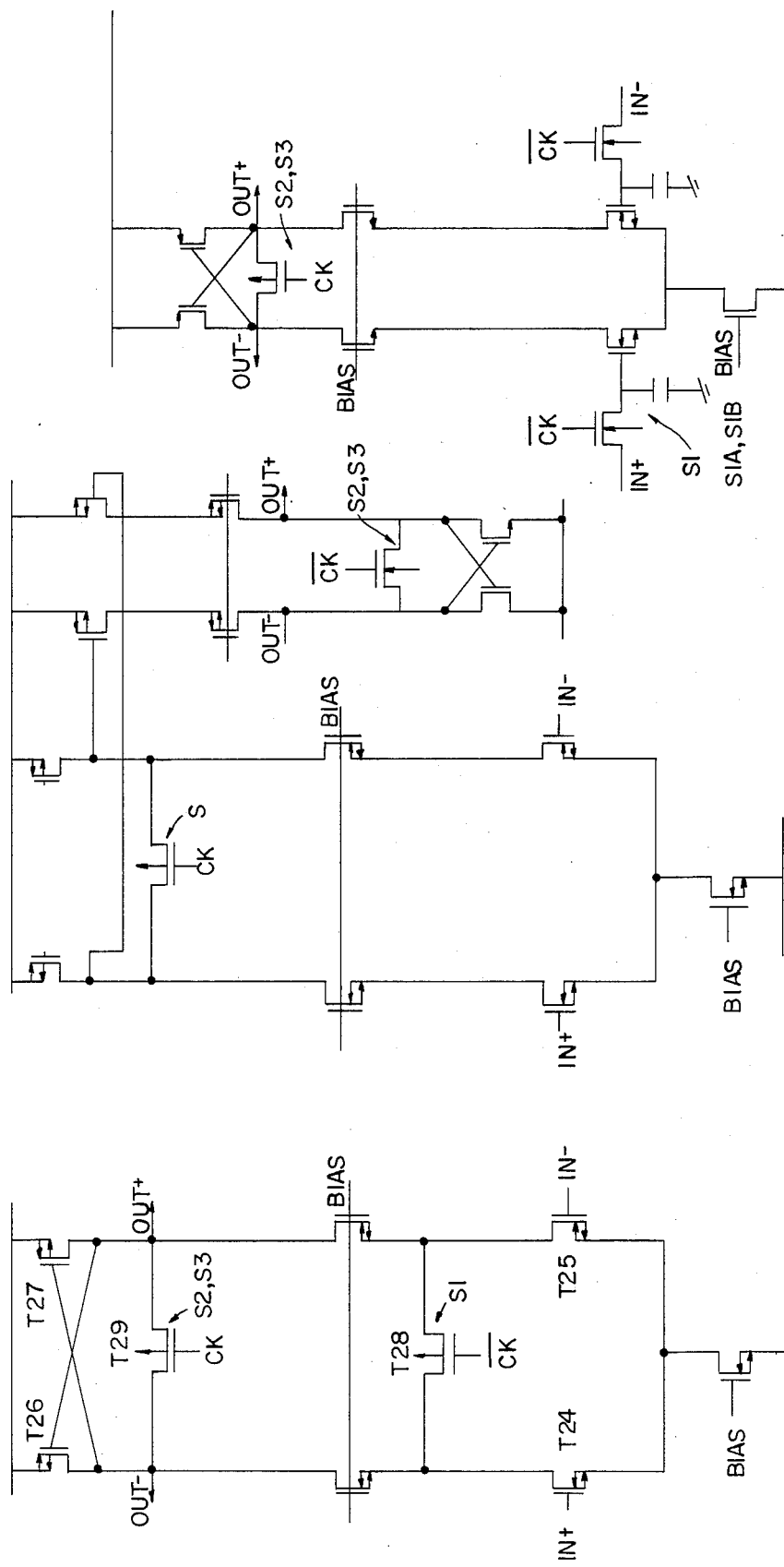

SWITCHED IMPEDANCE COMPARATOR

BACKGROUND OF THE INVENTION

This invention relates generally to high-speed synchronous comparator circuits and, more particularly, to comparators of the type used in analog-to-digital converters (ADCs). There are a number of different types of analog-to-digital converters. Perhaps the two most commonly used types are the flash architecture and the successive approximation architecture. Both architectures include comparators, and will be briefly described by way of background.

The flash, or parallel threshold, architecture uses multiple comparators, one for each quantization level. Thus, for a given input signal, all comparators referenced to threshold levels below the input signal will be actuated and all comparators referenced to threshold levels above the input signal will not be actuated. Thus, the comparators produce a "thermometer" code indicative of the binary value of the input signal, and this is further decoded to provide an equivalent digital output signal.

In the successive approximation type of ADC, the input signal is first compared with the analog equivalent of a half-scale reference value stored in a successive approximation register, to determine the most significant bit of the digital value of the input signal. Successively less significant bits are determined by repeatedly updating the register and making comparisons between the input signal and the analog equivalent of the register contents. Each cycle of operation produces one more bit of significance in the digital output.

In all types of ADC, the comparator plays a critical role. It has to compare a relatively small analog differential input signal and produce a large digital output signal. Thus, it ideally needs high gain. Further, the speed of the ADC ultimately depends on the speed of the comparator or comparators used in it.

The present state of the art of comparator circuits uses a circuit configuration referred to as differential current mode logic (DCML). Typically, such a configuration includes a current-mode logic (CML) transistor pair that is used for acquisition, referred to as the acquisition pair, and another pair of transistors also connected in CML, referred to as the latch pair. During an acquisition phase, the latch pair is totally disabled by the action of a clock signal and the acquisition pair is enabled by the same signal. A differential input signal is applied to the acquisition pair. The latch pair is cross-coupled to provide positive feedback to quickly latch and amplify the acquisition signal. During the latching phase, the acquisition pair is disabled and the latching pair is enabled. This switching of the two amplifier pairs leads to some significant disadvantages.

Two important parameters of comparators are its speed and its resolution. As will be further discussed, the speed of comparators of the prior art, such as DCML comparators, is limited by the time needed to switch from acquisition mode to latching mode. Moreover, the resolution obtainable from DCML comparators is inherently limited.

In any comparator, previous values of the input signal tend to create a hysteresis effect, whereby the latch amplifier tends to select the previous polarity of the input signal. When a DCML comparator switches from the latching phase to the acquisition phase, the previously latched signal remains on a pair of high-impedance nodes of the latching pair. This residual value has to be overcome by the new value of the input signal. This effect degrades comparator resolution.

In the DCML comparator, the acquisition pair and the latch pair are being switched on and off, and this creates voltage steps at the common source node of the pair. These voltage steps are typically coupled capacitively back to the signal inputs, by device internal capacitances (gate-source capacitance in field-effect transistor amplifiers, or base-emitter capacitance in bipolar transistor amplifiers). This can result in comparator errors.

Another significant disadvantage of the DCML comparator is that its speed is inherently limited by the time that it takes to switch off the acquisition pair and switch on the latch pair. After the comparator switches from acquisition mode to latching mode, a certain delay time must elapse before the acquisition pair is fully disabled, to ensure that no input signals can feed through to the latching pair. This "hold" time can be a significant portion of the total latching time. If the hold time is shortened, the latch output can be subject to errors. This problem ultimately limits the overall comparator speed. In the DCML comparator, there is a delay between the time that the acquisition pair turns off and the latching pair turns on. During this delay, the signal at the high-impedance nodes of the latching pair leaks away and reduces the initial latch signal available to the latching pair. Therefore, the latching time to obtain a desired output signal level is increased.

It will be appreciated from the foregoing that there is a significant need for improvement in the field of synchronous comparators for use in such applications as analog-to-digital converters. Specifically, what is needed in a comparator is a combination of high speed of operation and high gain in the latching or regeneration phase of operation. Ideally, a comparator should also not be subject to the disadvantages suffered by DCML comparators of the prior art. The present invention meets all of these requirements.

SUMMARY OF THE INVENTION

The present invention resides in a synchronous comparator switchable between an acquisition mode and a latch mode, and having acquisition amplifiers and latching amplifiers configured such that the critical node impedances are optimized while both latching and acquisition amplifiers always remain in an on condition. In the acquisition mode, the critical nodes of the amplifiers are held in a low-impedance state, so that the latching amplifiers, although still on, have a positive feedback loop gain of less than unity. In the latching or regeneration mode, the nodes are switched to a high-impedance state and the positive feedback loop gain is increased to provide an amplified digital output signal.

Briefly, and in general terms, the comparator of the invention comprises an amplifier and switch means. The amplifier, which includes an acquisition amplifier and a latching amplifier, is switchable between an acquisition mode, for rapidly acquiring an analog differential input signal at a pair of amplifier nodes, and a regeneration mode in which the signal is latched and amplified via positive feedback to provide an output signal indicative of the polarity of the differential input signal. The switch means alternately selects the acquisition mode, which provides a positive amplifier feedback loop gain of much less than unity, and the regeneration mode, which provides a positive amplifier feedback loop gain of much greater than unity.

The switch means of the presently preferred embodiment of the invention includes first switch means for selectively connecting a relatively low impedance between the internal amplifier nodes, and second switch means for isolating the acquisition amplifier from the internal latch amplifier nodes during the regeneration mode.

Because the switch means of the invention has the effect of resetting or zeroing the output nodes of the acquisition amplifier, the hysteresis effect is greatly reduced in the comparator of the invention, thereby improving resolution. Also, since both the acquisition amplifier and the latching amplifier are on all the time, this eliminates any problems arising from generation of voltage transients generated by alternately switching amplifiers on and off. The invention also significantly reduces the hold time needed to complete isolation of the acquisition amplifiers, and provides an overall speed faster than that of prior art comparators. During switching of the comparator from acquisition to latching mode, the latching amplifier is fully enabled before isolation of the acquisition amplifier. Thus the acquired signal is available without attenuation at the start of the regeneration phase.

In the acquisition mode, the critical node impedances are low, giving the acquisition amplifier low gain but very wide bandwidth, (and the latch amplifier a positive feedback loop gain less than unity) and facilitating extremely high speed acquisition of the input signal. During the latch mode of operation, the critical node impedances are switched to a high impedance, creating a high positive feedback loop gain, and thereby optimizing latch speed. In the comparator of the invention, the critical amplifier node impedances are optimized for both the acquisition mode and the regeneration mode. This is critical to obtaining improved resolution, and speed in both modes of operation.

In terms of a novel method, the invention includes the steps of applying an analog differential input signal to the input terminals of an amplifier, latching the input signal into a pair of latch amplifier nodes during an acquisition phase in which the amplifier is operated at a positive feedback loop gain of less than unity, and switching the amplifier configuration for a regeneration phase in which the input terminals are isolated from the amplifier nodes, and the latch amplifier is operated at a positive feedback loop gain of greater than unity, to provide an amplified output from the signal latched into the amplifier nodes. In a typical environment, the method also includes the step of switching the amplifier configuration alternately between the acquisition phase and the regeneration phase, to provide amplified outputs indicative of the polarities of successively acquired differential input signals.

It will be appreciated from the foregoing that the present invention represents a significant advance in the field of high-speed synchronous comparators. In particular, the invention eliminates the disadvantages of the prior-art comparators by providing that acquisition and latching amplifiers remain on during both phases of operation. During the transitions between phases of operation, the impedances of the internal amplifier nodes are switched between a low-impedance state, for the acquisition phase, and a high-impedance state, for the regeneration phase. During the regeneration phase, the acquisition amplifiers are effectively isolated by the same switching mechanism that switches the impedance state of the nodes.

The specific manner of implementation of the switches depends on the technology used to fabricate the comparator. In gallium arsenide field-effect transistor (GaAs FET) technology and in silicon bipolar technology, the switches can be conveniently implemented as diodes and transistors in combination. In complementary metal oxide semiconductor (CMOS) technology, the switches can take the form of CMOS devices.

Other aspects and advantages of the invention will become apparent from the following more detailed description, taken in conjunction with the accompanying drawings.

BRIEF DESCRIPTION OF THE DRAWINGS

FIG. 6 is a detailed schematic diagram of the comparator of the invention implemented in CMOS technology;

FIGS. 6a and 6b are fragmentary schematic diagrams showing alternate implementations of the switching arrangements of FIG. 6;

FIGS. 7-9 are schematic diagrams showing alternate CMOS embodiments of the comparator.

DESCRIPTION OF THE PREFERRED EMBODIMENTS

Figure 1:
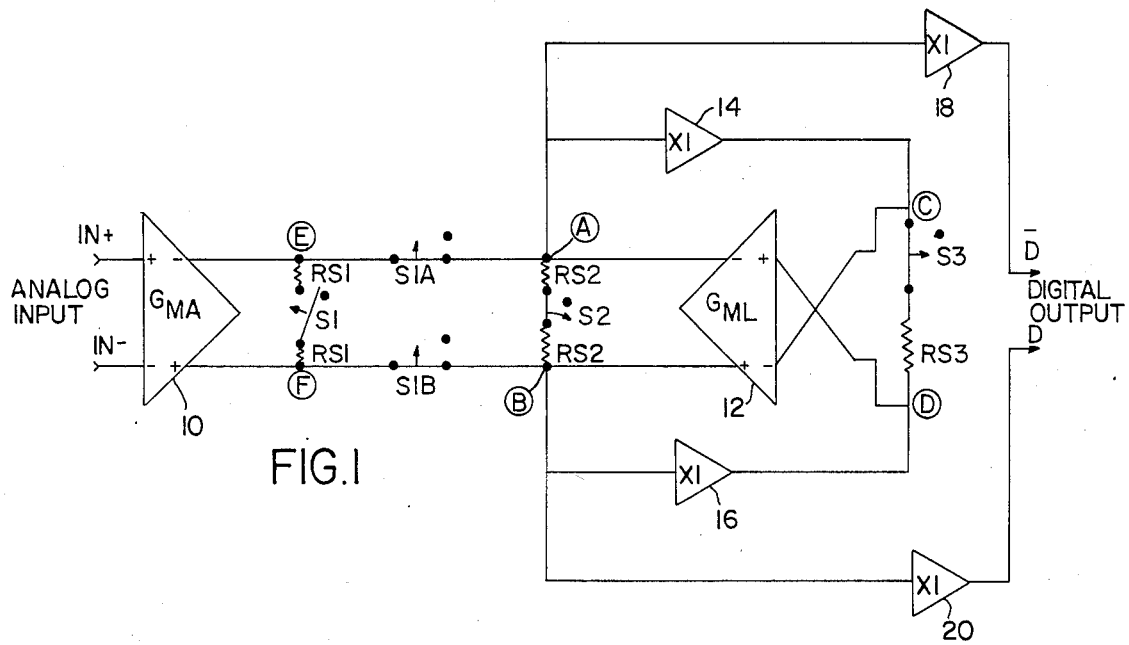
FIG. 1 is a simplified schematic diagram of a comparator showing the principles of the present invention.

As shown in the drawings for purposes of illustration, the present invention is concerned with high-speed synchronously operated comparators. Although the principal application for such comparators is in the field of analog-to-digital converters, the comparator of the invention is not limited to this application, and is not limited to any particular type of converter. In short, the invention has application to any field requiring a comparator that is synchronously operated, i.e. clock-driven, and must operate at high speed and provide an amplified digital output signal.

As explained in the introductory section of this specification, comparators of the prior art typically include an acquisition amplifier pair and a latching amplifier pair. These are alternately enabled and disabled by clock signals applied to current-mode-logic circuitry, to switch current from one amplifier pair to the other. This approach gives rise to significant drawbacks, not the least of which is a limited speed of operation.

In accordance with the invention, a comparator has an acquisition amplifier and a latching amplifier that are both in an "on" state for all phases of operation. During acquisition, the latching amplifier is switched to a condition in which its amplifier nodes have a relatively low impedance, for operation with a positive feedback loop gain of less than unity. During latching or regeneration, the nodes are switched to a high-impedance state and the latching amplifier operates with a positive feedback loop gain of greater than unity, to provide an amplified output signal indicative of the polarity of the input signal.

FIG. 1 shows the comparator of the invention in diagrammatic form, including an acquisition amplifier, indicated by reference numeral 10, a latching amplifier 12, four unity-gain buffers 14, 16, 18 and 20, and other components to be described. The acquisition amplifier 10 receives a differential input signal, referred to as IN+, IN−, and produces a differential output at nodes E and F. The acquisition amplifier 10 has a transconductance $G_{mA}$.

Nodes E and F are connected through two resistances RS1 and a switch S1, which is open during the acquisition mode of operation. Node E is connected to node A through a switch S1A, and node F is connected to node B through another switch S1B. Nodes A and B are the output terminals of the latching amplifier 12, which has a transconductance $G_{mL}$. Nodes A and B are connected through unity-gain buffers 14 and 16, respectively, to nodes C and D, which are cross-coupled to the input terminals of the latching amplifier. Nodes A and B are also connected through unity-gain buffers 18 and 20, respectively, to the output terminals of the comparator. There are two other switches in the circuit. Switch S2 connects nodes A and B, through two series resistances RS2, and switch S3 connects nodes C and D, through a series resistance RS3. Switches S2 and S3 are both closed during the acquisition mode, as shown in the figure.

During acquisition, the input signal applied to the acquisition amplifier 10 generates a differential signal across nodes A and B, C and D, and E and F, indicative of the polarity of the input signal. High-gain operation of the latching amplifier 12 is suppressed by the resistances RS2 and RS3, which effectively short-circuit the inputs and outputs of the latching amplifier to some degree, but do not switch it off. At the start of the latching or regeneration phase of operation, switch S1 is closed, and switches S1A, S1B, S2 and S3 are all open. Switches S1A and S1B effectively isolate the acquisition amplifier from the latching amplifier, so that any subsequent changes in the input signal are decoupled from the latching amplifier and have no effect. The latching amplifier 12 functions in the regeneration mode as a high-gain amplifier with positive feedback, and a positive feedback loop gain of greater than unity.

It can be seen by tracing a signal path from node A to nodes C, B, and D, and then back to A again, that an increase in the level at A will result in a further increase in the level at A. In other words, the circuit has positive feedback. In the acquisition mode, positive feedback is still present, but the addition of the impedances between A and B, and C and D, reduce the feedback loop gain of the circuit to less than unity, and there is negligible positive feedback amplification. This arrangement not only results in a comparator of high speed, and high gain in the regeneration phase, but also avoids the disadvantages of comparators of the DCML type.

Figure 2:
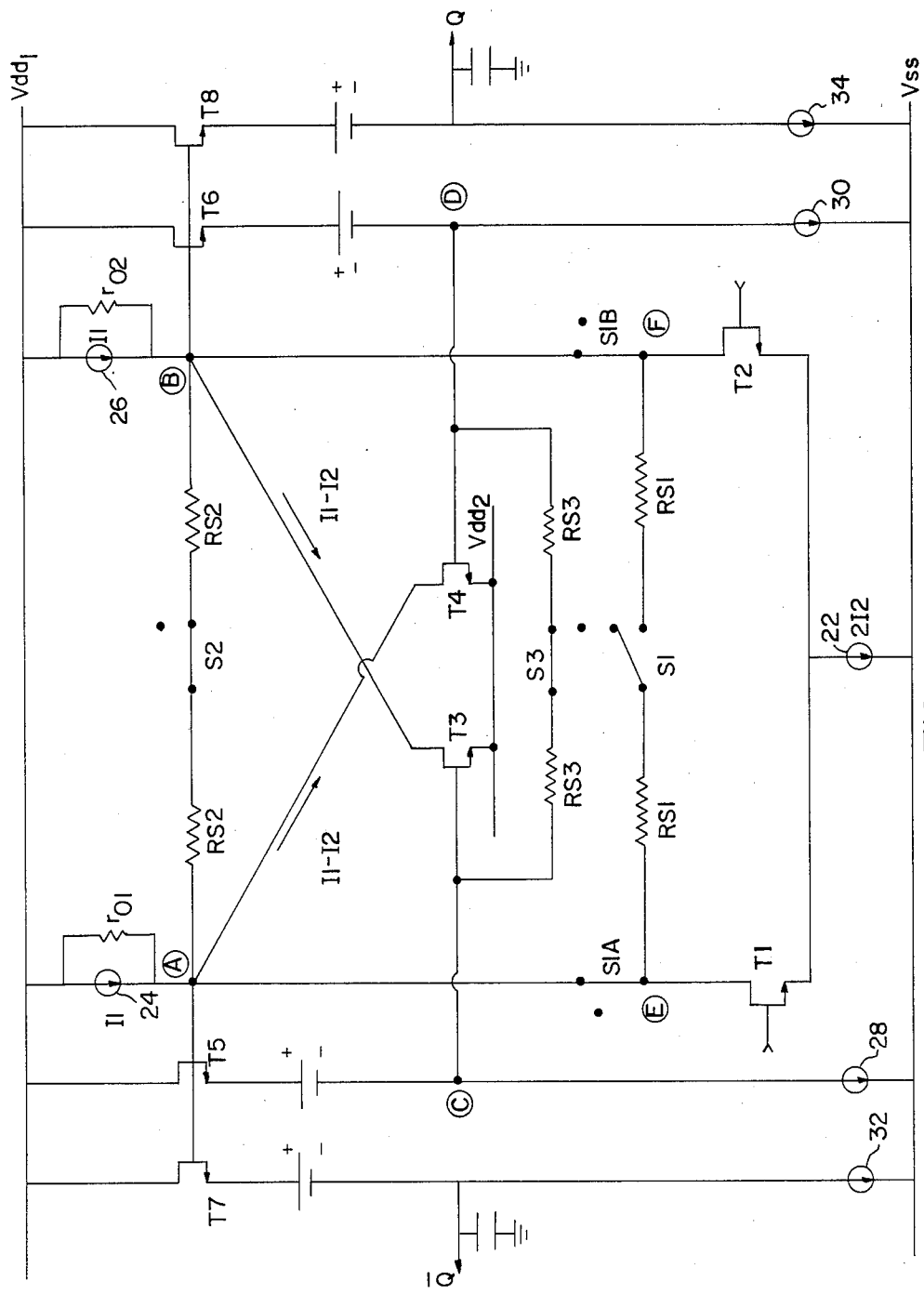
FIG. 2 is a more detailed schematic diagram of the comparator of FIG. 1.

The schematic diagram of FIG. 2 shows the structure of the comparator in more detail. The comparator includes a first pair of amplifier elements, indicated as T1 and T2, which form the acquisition pair. T1 and T2 are shown as three-terminal amplifier devices, which may be almost any semiconductor amplifier, such as gallium arsenide field-effect transistors (GaAs FETs), metal oxide semiconductor field-effect transistors (MOSFETs), or bipolar junction transistors (BJTs). For convenience, the terminals of these devices are referred to by the terms source, drain and gate, but it will be understood that other terms may apply, depending on the nature of the devices.

The differential input signal is applied to the gate terminals of the acquisition pair T1, T2. The source terminals of the pair are connected in common through a current source, referred to by reference numeral 22, to a supply bus Vss. The drain terminals of the acquisition pair are the nodes E and F, and these are connected through switches S1A and S1B, respectively, to nodes A and B. Node A is connected through a current source 24 to another supply bus Vdd1, and node B is connected to the same bus through current source 26.

Two additional amplifiers T3 and T4 form the latching pair of the comparator. The source terminals of T3 and T4 are connected in common to another supply bus Vdd2. The drain of amplifier T3 is connected to node B and the drain of amplifier T4 is connected to node A. The gate terminals of amplifiers T3 and T4 are connected to nodes C and D, respectively. Nodes C and D are connected to the source terminals of additional amplifiers T5 and T6, respectively. T5 has its drain connected to the Vdd1 supply line, and its source connected through a level shifter to node C, and thence through a current source 28 to the Vss supply line. The gate of amplifier T5 is connected to node A. Likewise, amplifier T6 has its drain connected to the Vdd1 line, and its source connected through a level shifter to node D, and thence through another current source 30 to the Vss supply line. The gate of amplifier T6 is connected to node B.

Two other amplifier devices T7 and T8 complete the comparator. Amplifier T7 is connected in parallel with amplifier T5, having its drain connected to the Vdd1 line and its source connected through a level shifter to a complementary output terminal $\overline{Q}$, and thence through another current source 32 to line Vss. The gate terminal is connected to node A. Likewise, amplifier T8 has its drain connected to the Vdd1 line, and its source connected through a level shifter to the other output terminal Q, and thence through another current source 34 to the Vss line. For completeness, each of the output terminals has a capacitance $C_L$ to ground.

As in FIG. 1, FIG. 2 also includes a path connecting nodes E and F through resistance RS1, a series switch S1 and a second resistance RS1. A similar path connects nodes A and B, through resistance RS2, a series switch S2, and a second resistance RS2. Finally, there is a path between nodes C and D, through resistance RS3, series switch S3 and a further resistance RS3. In accordance with the invention, the switches S1, S2, S3, S1A and S1B are operated, during the transitions between acquisition mode and regeneration mode, to provide a higher impedance for the nodes C and D during regeneration mode than during acquisition mode, and to isolate the acquisition pair T1, T2 during the regeneration mode. The specific manner in which the switches are implemented will be discussed later. For purposes of explanation of FIG. 2, each of the switches S1, S2, S3, S1A and S1B may be considered to be a single-pole-single-throw switch.

During acquisition mode, the switches are in the condition shown in FIGS. 1 and 2, i.e. switch S1 is open and switches S1A, S1B, S2 and S3 are all closed. The acquisition pair T1, T2 together conducts the same current as the common current source 22. Depending on the polarity of the differential input signal applied to the gate terminals of the acquisition pair, either T1 or T2 will be more conductive, and the relative voltage levels at nodes E and F will be indicative of the polarity of the input signal. Since switches S1A and S1B are closed during acquisition, nodes E and F are connected directly to nodes A and B, respectively.

It will be observed that the latching pair T3, T4 are cross-coupled to provide positive feedback and that the latching pair T3, T4 cooperate with the amplifiers T5 and T6 to provide a regenerative amplifier circuit. Amplifiers T5 and T6 are equivalent to the unity-gain buffers 14 and 16 of FIG. 1, and amplifiers T7 and T8 are equivalent to the buffers 18 and 20. In the regeneration mode, the voltage difference generated at nodes A and B during acquisition is amplified by the latching pair T3, T4, and output as a digital output signal indicative of the polarity of the differential input signal.

Figure 3:
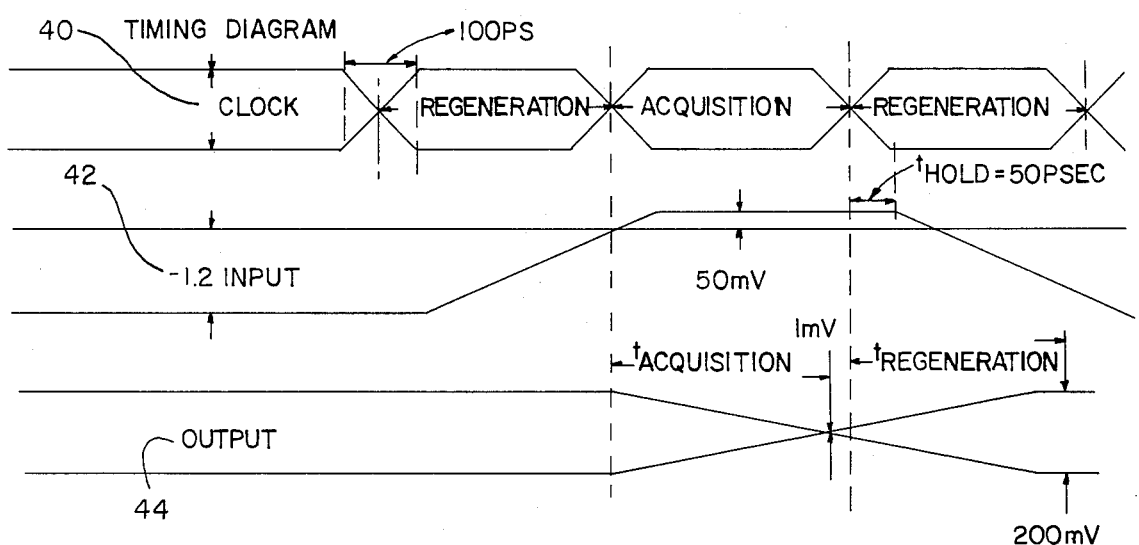
FIG. 3 is a timing diagram showing the relationship between a clock signal, an input signal and an output signal in the comparator of FIGS. 1 and 2.

FIG. 3 shows the relationship between a clock signal 40, an input signal 42 and an output signal 44 in the comparator of the invention. The clock signal switches back and forth between acquisition and regeneration modes, as shown. The transition time between modes is approximately 100 picoseconds, The illustrative input signal 42 has a strongly negative initial value of $-1.2$ volts, and changes to a very small positive value of $+50$ millivolts (mV). The output signal 44 is actually the one measured at nodes C and D of FIGS. 1 and 2, and provides a level of about 200 mV prior to the acquisition phase under consideration. During the acquisition phase, the output signal falls rapidly, changes polarity, and assumes a very small level of opposite polarity by the end of the acquisition phase. There is a slight further amplification of this signal prior to the end of the acquisition phase. After the transition to the regeneration mode, The signal held at nodes C and D is amplified to about 200 mV again, but is of opposite polarity to the initial output signal.

The manner in which the switches S1, S1A, S1B, S2 and S3 are implemented is very much dependent on the semiconductor technology employed. One presently preferred approach is to use the enhancement/depletion gallium arsenide process, as shown in detail in FIG. 4. In this process, each of the amplifier devices T1-T8 of FIG. 2 is implemented as at least one gallium arsenide field-effect transistor (FET). For example, the acquisition pair T1, T2 of FIG. 2 is implemented in FIG. 4 as FETs J1 and J2. The latching amplifier pair T3, T4 is implemented as FETs J9 and J10. Similarly, J12 and J13 are equivalent to T5 and T6, respectively, and J1; and J14 are equivalent to T7 and T8, respectively.

Figure 4:
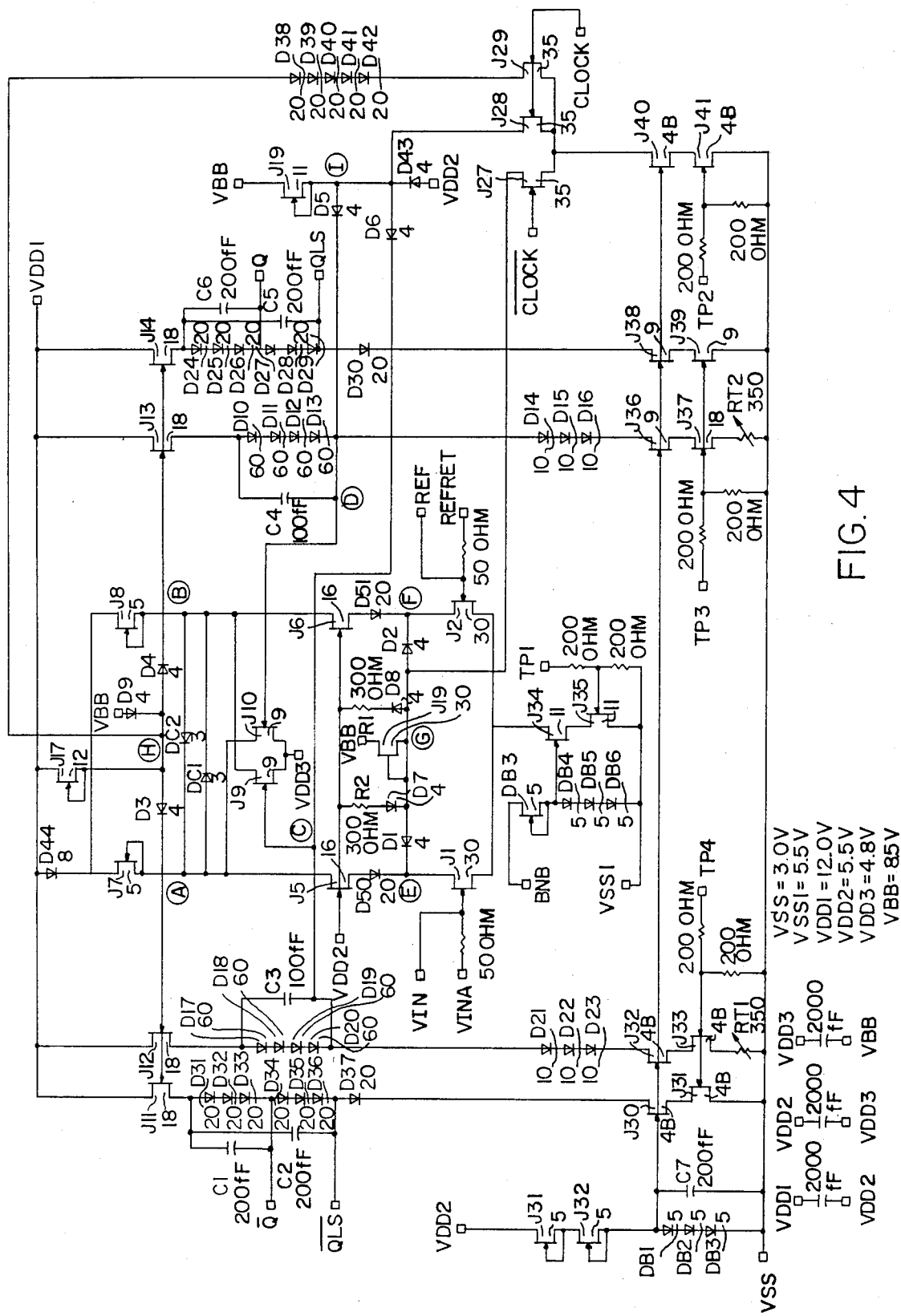
FIG. 4 is a detailed schematic diagram of the comparator of the invention implemented in GaAs field-effect transistor technology.

For purposes of explanation of the manner in which the switches S1, S2 and S3 are implemented, fragmentary portions of FIG. 4 will be discussed in detail. First, the portion of the circuit between nodes E and F includes two diodes D1 and D2 in series, with their anodes connected together to a midpoint referred to as node G. Connected to node G is a FET J19 providing a current source to the node. Also connected to node G is another FET J27, the gate terminal of which is supplied with one side of a differential clock signal. This latter FET J27 is connected to another current generator, comprising FETs J40 and J41. When the clock-controlled FET J27 is closed, as it is during acquisition mode, current from FET J19 passes through FET J27, but J19 cannot provide sufficient current to satisfy the source J40, J41. Consequently, node G is "pulled down" to about one volt below VDD2, at which point current flows through resistor R2 and diode D7. Diodes D1 and D2 are, at this stage, reverse biased, and switch S1 is open. The path between nodes E and F appears to be open-circuited, since diodes D1 and D2 are not conductive. In this condition, nodes E and F are pulled down in level by the acquisition pair J1, J2, so that diodes D50 and D51 are conductive and switches S1A and S1B are held in the closed condition.

When the clock signals switch FET J27 off, as in the regeneration mode, node G is "pulled up" in voltage and the diodes D1 and D2 become conductive. Nodes E and F then behave as though connected by small resistances, provided by the internal resistances of the diodes. This is the condition in which switch S1 is closed. Because node G is pulled up in this condition, so are nodes E and F. At some predetermined level, the voltage on node G will cause conduction through diode D8 and resistor R4. Consequently, the voltage at nodes E and F will be a little higher than VDD2, causing devices J5, D50 and J6, D51 to be in the off condition. In this condition, diodes D50 and D51 cease to conduct, and switches S1A and S1B are effectively opened when switch S1 is closed.

Switches S2 and S3 are implemented in a similar manner to switch S1. Connected between nodes A and B are diodes D3 and D4, with their anodes connected together at a node H, which receives current from a current generator in the form of a FET J17, and is connected through clock-controlled FET J29 to the already mentioned current generator J40, J41. When the clock-controlled FET J29 is conductive, as it is in the regeneration mode, node H remains at a relatively low voltage level and diodes D3 and D4 are not conductive. This is equivalent to having switch S2 open. When clock-controlled FET J29 is not conductive, as it is in the acquisition mode, the level of node H is pulled up, the diodes D3 and D4 become conductive, and nodes A and B appear to be connected together by a small resistance, the internal resistance of the diodes.

Switch S3 operates in a similar manner to switch S2, using diodes D5 and D6, current source J18, and clock-controlled switch J28, which operates in unison with switch J29.

Figure 5:
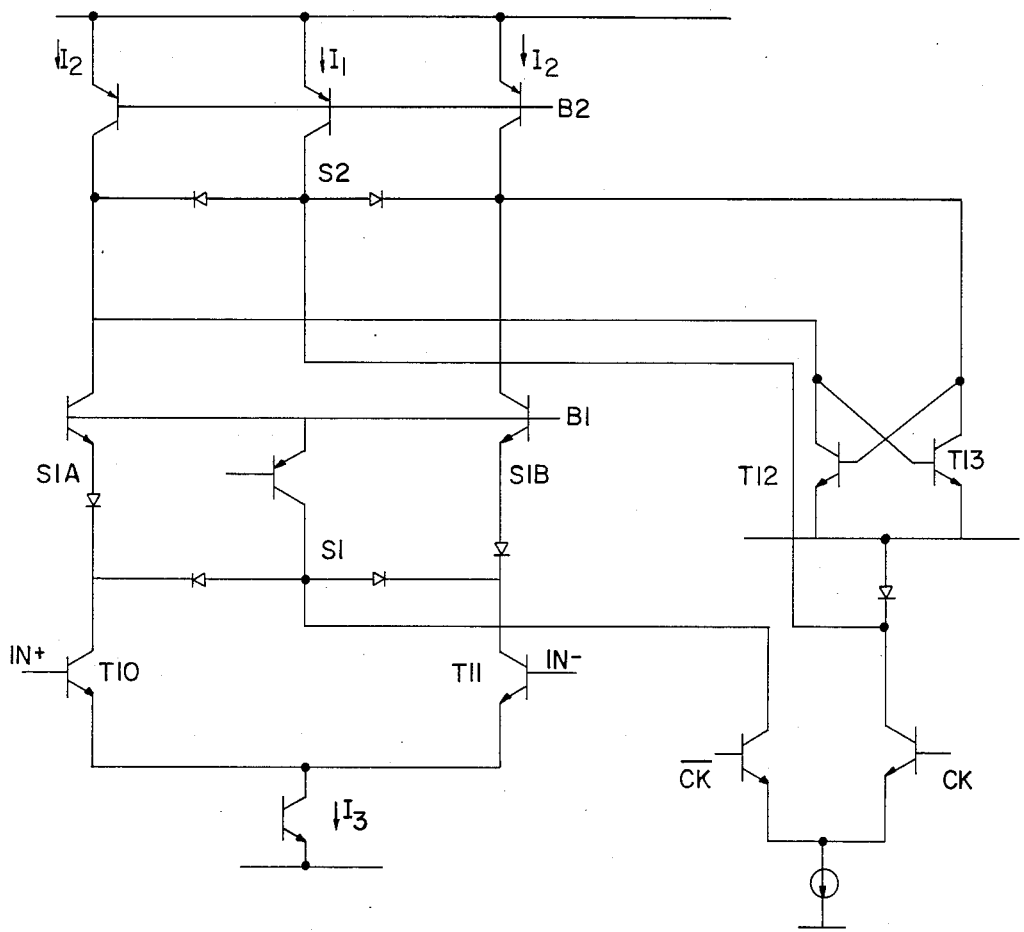
FIG. 5 is a detailed schematic diagram of the comparator of the invention implemented in bipolar transistor technology.

FIG. 5 illustrates how the principles of the invention can be implemented in bipolar semiconductor technology. The circuit in this form includes an acquisition pair of transistors T10, T11, and a latching pair of transistors T12, T13, which are cross-coupled as shown. Switches S1 and S2 are implemented as diodes in the same manner as in FIG. 4, and switches S1A and S1B are implemented as a diode and an NPN transistor for each switch.

FIG. 6 shows the comparator of the invention implemented in CMOS technology. The circuit includes an acquisition pair of devices T14, T15, and a latching pair T16, T17. The CMOS implementation is characterized by the simplicity with which the switches can be realized. Switch S1 is formed by the two series transistors T18, T19, connected between nodes E and F and both controlled by a clock signal. Switches S1A and S1B are formed by the additional transistors T20, T21, which are biased to an on condition when S1 is open. When S1 is closed, an additional device T22 connected between the bias line of T20, T21 and the midpoint between T18 and T19, is turned on and the devices T20, T21 are opened. Switch S2 is merely a clock-controlled transistor T23 connected across the nodes of the latching pair.

FIG. 6a shows an alternate approach to the implementation of switches S1A and S1B. FIG. 6b shows an alternate implementation of switches S2 and S3.

FIG. 7 is yet another CMOS version of the comparator, including an acquisition pair T24, T25, a latching pair T26, T27, a clock-controlled device T28 to provide switch S1, and a clock-controlled device T29 to provide switches S2 and S3. Switches S1A and S1B are omitted.

FIG. 8 is a further alternative CMOS implementation, similar to FIG. 7 but providing a higher degree of isolation of the latching pair from the input signals.

Finally, FIG. 9 is another version of the CMOS implementation of the invention, using switched capacitors at the inputs.

It will be appreciated from the foregoing that the present invention represents a significant advance in the field of synchronous comparators. In particular, the invention operates very rapidly during both acquisition and regeneration, and provides a high gain during regeneration. In addition to its high speed and gain, the comparator of the invention has significantly reduced hysteresis, and does not suffer the voltage "kicks" at its inputs that have been typical in other comparators. The impedance switching technique of the invention achieves optimization of node impedances in both acquisition and regeneration modes. In the preferred embodiment of the invention, the node impedance is switched before the acquisition amplifier is isolated from the latching amplifier, thereby preserving the acquisition signal at the start of regeneration.

It will also be appreciated that, although an embodiment of the invention has been described in detail for purposes of illustration, various modifications may be made without departing from the spirit and scope of the invention. In particular, it will be understood that bipolar versions using either PNP or NPN configurations may be designed in accordance with the invention, and that other embodiments may be designed using a single-ended clock signal rather than complementary clock signals as shown. All of these variants of the invention fall within the contemplated scope of the present invention. Accordingly, the invention is not to be limited except as by the appended claims.

I claim:

1. A synchronous comparator circuit, comprising:
   a pair of differential input terminals;
   a pair of output terminals for providing an amplified output signal indicative of the polarity of the differential input signal;
   amplifier means coupled to the input terminals and the output terminals; and
   switch means coupled to the amplifier means and switchable under control of a clocking signal between a first state in which the amplifier means has a positive feedback loop gain of less than unity and the differential signal on the input terminals is coupled to a pair of internal switched impedance nodes, and a second state in which the input terminals are isolated from the switched impedance nodes, and the amplifier means has a positive feedback loop gain of greater than unity, to provide an amplified output signal at the output terminals.

2. A comparator circuit as defined in claim 1, wherein:
   the switch means in its first state is operative to connect a low impedance across the internal switched impedance nodes, thereby reducing the positive feedback loop gain to below unity and minimizing the effect of positive feedback; and
   the switch means in its second state is operative to connect a high impedance across the internal switched impedance nodes, thereby permitting a positive feedback loop gain of greater than unity and providing a greatly amplified output signal.

3. A comparator circuit as defined in claim 2, wherein the amplifier means includes:
   an acquisition amplifier having a pair of semiconductor amplifier devices; and
   a latch amplifier having a pair of cross-connected semiconductor amplifier devices, in which the output of each device is coupled to the input of the other, to form a positive feedback loop.

4. A comparator circuit as defined in claim 3, wherein the switch means includes:
   first switch means for selectively connecting a relatively low impedance between the internal switched impedance nodes; and
   second switch means for isolating the acquisition amplifier from the internal switched impedance nodes.

5. A comparator circuit as defined in claim 4, wherein:
   the amplifiers and switch means are implemented as semiconductor field-effect transistors.

6. A comparator circuit as defined in claim 4, wherein:
   the amplifiers and switch means are implemented as semiconductor bipolar transistors.

7. A comparator circuit for use in an analog-to-digital converter, the comparator circuit comprising:
   a pair of differential input terminals for receiving a differential input signal;
   a pair of output terminals for providing an amplified output signals indicative of the polarity of the differential input signal;
   an acquisition amplifier coupled to the input terminals, for acquiring and amplifying the differential input signal;
   a latch amplifier for latching the acquired signal into a pair of internal switched impedance nodes, and for providing amplification between the internal nodes and the output terminals; and
   switch means switchable by clocking signals between a first state and a second state, the first state being one in which the acquisition amplifier and the latch amplifier are coupled together to acquire the input signal into the internal switched impedance nodes, and in which the latch amplifier provides a positive feedback loop gain of less than unity, and the second state being one in which the acquisition amplifier is isolated from the latch amplifier, and the latch amplifier provides a positive feedback loop gain of greater than unity, to yield an amplified output signal, at the output terminals, indicative of the polarity of the differential input signal.

8. A comparator circuit as defined in claim 7, wherein:
   the switch means in its first state is operative to connect a low impedance across the internal switched impedance nodes, thereby reducing the feedback loop gain to below unity and minimizing the effect of positive feedback; and
   the switch means in its second state is operative to connect a high impedance across the internal switched impedance nodes, thereby permitting a positive feedback loop gain of greater than unity and providing an amplified output signal.

9. A comparator circuit as defined in claim 8, wherein:
the acquisition amplifier includes a pair of semiconductor amplifier devices; and
the latch amplifier includes a pair of cross-coupled semiconductor amplifier devices, in which the output of each device is coupled to the input of the other, to form a positive feedback loop.

10. A comparator circuit as defined in claim 9, wherein the switch means includes:
first switch means for selectively connecting a relatively low impedance between the internal switched impedance nodes; and
second switch means for isolating the acquisition amplifier from the internal switched impedance nodes.

11. A comparator circuit as defined in claim 10, wherein:
the amplifiers and switch means are implemented as semiconductor field-effect transistors.

12. A comparator circuit as defined in claim 10, wherein:
the amplifiers and switch means are implemented as semiconductor bipolar transistors.

13. A synchronous comparator circuit, comprising:
a comparator switchable to an acquisition mode, for rapidly acquiring an analog differential input signal and latching it into a pair of switched impedance nodes, and switchable to a regeneration mode in which the latched signal is amplified to provide an output signal indicative of the polarity of the differential input signal; and
switch means for alternately selecting the acquisition mode, which provides a latch amplifier positive feedback loop gain of less than unity, and the regeneration mode, which provides a latch amplifier positive feedback loop gain of greater than unity.

14. A comparator circuit as defined in claim 13, wherein the switch means includes:
first switch means for selecting a low impedance between the switched impedance nodes in the acquisition mode, to reduce the feedback loop gain, and a high impedance between the nodes in the regeneration mode; and
second switch means for isolating the differential input signal from the switched impedance nodes in the acquisition mode.

15. A comparator circuit as defined in claim 14, wherein:
the first switch means operates before the second switch means during transition between the acquisition mode and the regeneration mode, to preserve the acquired signal until regeneration begins.

16. A method of operation of a synchronous comparator circuit, comprising the steps of:
applying an analog differential input signal to the input terminals of an acquisition amplifier;
acquiring the input signal into a pair of switched impedance nodes during an acquisition phase in which a latch amplifier is operated at a positive feedback loop gain of less than unity; and
switching the comparator to a different configuration for a regeneration phase in which the input terminals are isolated from the switched impedance nodes, and the amplifier is operated at a positive feedback loop gain of greater than unity, to provide an amplified output from the signal acquired into the switched impedance nodes.

17. A method as defined in claim 16, and further including the steps of:
switching the comparator configuration alternately between the acquisition phase and the regeneration phase, to provide amplified outputs indicative of the polarities of successively acquired differential input signals.

18. A method as defined in claim 16, wherein the step of switching the comparator configuration includes:
first switching the impedance of the switched nodes from a low to a high value to provide a positive feedback loop gain greater than unity; and
then isolating the input terminals from the switched impedance nodes.

19. A synchronous comparator circuit operable with a clocking signal, having:
amplifier means including two input terminals, output terminals and switched impedance nodes coupled to the input terminals and the output terminals, and having a positive feedback loop gain; and
switch means coupled to the amplifier means, and switchable under control of the clocking signal between a first state in which the impedance of the amplifier switched impedance nodes is at a low level and said circuit has a positive feedback loop gain of less than unity, and a second state in which the impedance of the switched impedance nodes is at a high level relative to said first state and the circuit has a positive feedback loop gain of greater than unity to provide an amplified output signal at the output terminals.

20. A comparator circuit as defined in claim 19, wherein:
the switch means in its first state is operative to connect a low impedance across the switched impedance nodes, thereby reducing the positive feedback loop gain to below unity and minimizing the effect of positive feedback; and
the switch means in its second state is operative to connect a high impedance across the switched impedance nodes, thereby permitting a positive feedback loop gain of greater than unity and providing a greatly amplified output signal.

21. A comparator circuit as defined in claim 20, wherein the amplifier means includes:
an acquisition amplifier having a pair of semiconductor amplifier devices; and
a latch amplifier having a pair of cross-connected semiconductor amplifier devices, in which the output of each device is coupled to the input of the other, to form the positive feedback loop.

22. A comparator circuit as defined in claim 21, wherein the switch means includes:
first switch means for selectively connecting a relatively low impedance between the switched impedance nodes during an acquisition mode of operation; and
second switch means for isolating the acquisition amplifier from the switched impedance nodes during the acquisition mode of operation.

23. A comparator circuit as defined in claim 22, wherein:
the amplifiers and switch means are implemented as semiconductor field-effect transistors.

24. A comparator circuit as defined in claim 22, wherein:
the amplifiers and switch means are implemented as semiconductor bipolar transistors.

* * * * *